United States Patent [19]

Matsui

[11] Patent Number: 5,444,661

[45] Date of Patent: Aug. 22, 1995

[54] SEMICONDUCTOR MEMORY DEVICE HAVING TEST CIRCUIT

[75] Inventor: Yoshinori Matsui, Tokyo, Japan

[73] Assignee: NEC Corporation, Tokyo, Japan

[21] Appl. No.: 186,142

[22] Filed: Jan. 25, 1994

[30] Foreign Application Priority Data

Jan. 25, 1993 [JP] Japan .................. 5-009632

[51] Int. Cl.[6] ............................................. G11C 29/00
[52] U.S. Cl. .............................. 365/201; 365/189.05; 371/21.1
[58] Field of Search ............... 365/201, 189.05, 230.06, 365/189.01; 371/21.1

[56] References Cited

U.S. PATENT DOCUMENTS 4,982,380 1/1991 Koike ..................... 371/21.1

Primary Examiner—David C. Nelms
Assistant Examiner—F. Niranjan
Attorney, Agent, or Firm—Sughrue, Mion, Zinn, Macpeak & Seas

[57] ABSTRACT

A semiconductor memory device is disclosed which has a data output circuit including a first node, a second node, first and second transistors connected in series between the first node and a potential line, third and fourth transistors connected in series between the first node and the potential line, fifth and sixth transistors connected in series between the second node and the potential line, seventh and eighth transistors connected in series between the second node and the potential-line, one of the first and third transistors being driven in response to a data signal read from a selected memory cell and one of the fifth and seventh transistors being driven in response to an inverted data signal of the data signal in a normal mode while turning one of the second and fourth transistor and one of the sixth and eighth transistors ON, both of the first and third transistors being driven in response to the data signal and both of the fifth and seventh transistors being driven in response to the inverted data signal while all the second, fourth, sixth and eighth transistors ON. The output circuit further includes an output logic circuit driving an output terminal to one of first and second logic levels when the first and second nods have logic levels different from each other and to a high impedance when the first and second nodes have logic levels equal to each other.

4 Claims, 5 Drawing Sheets

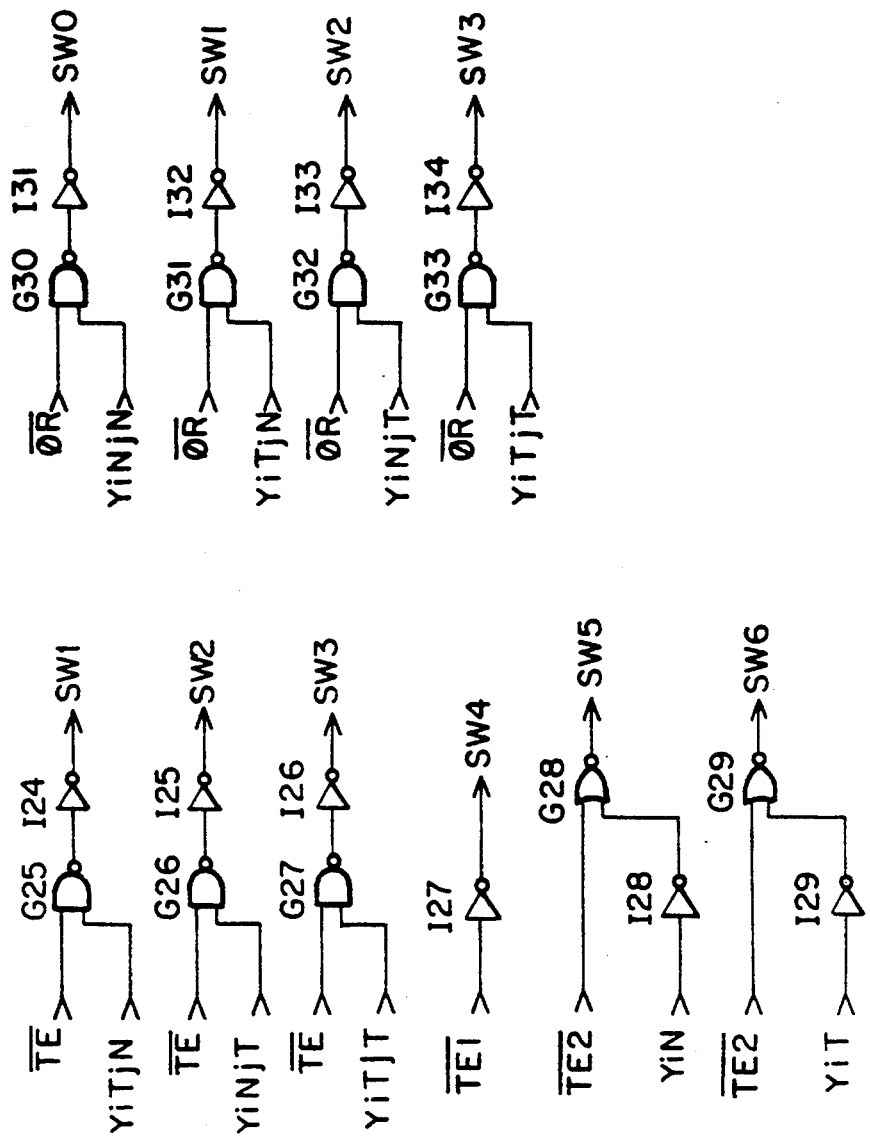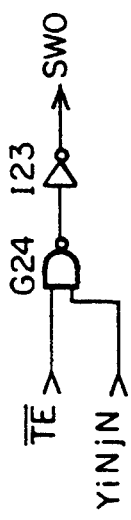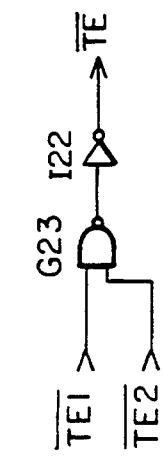

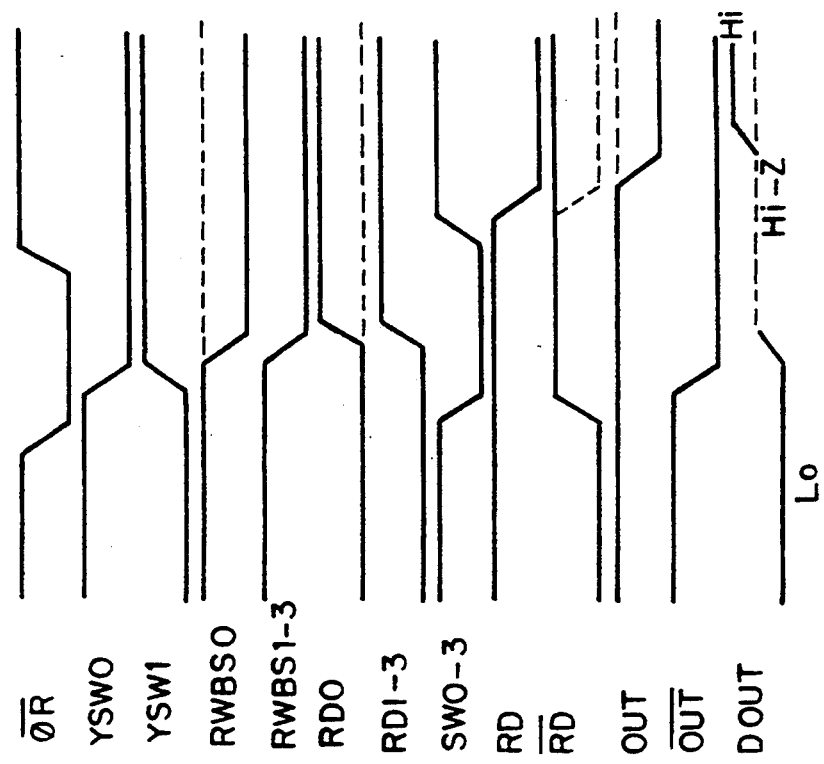
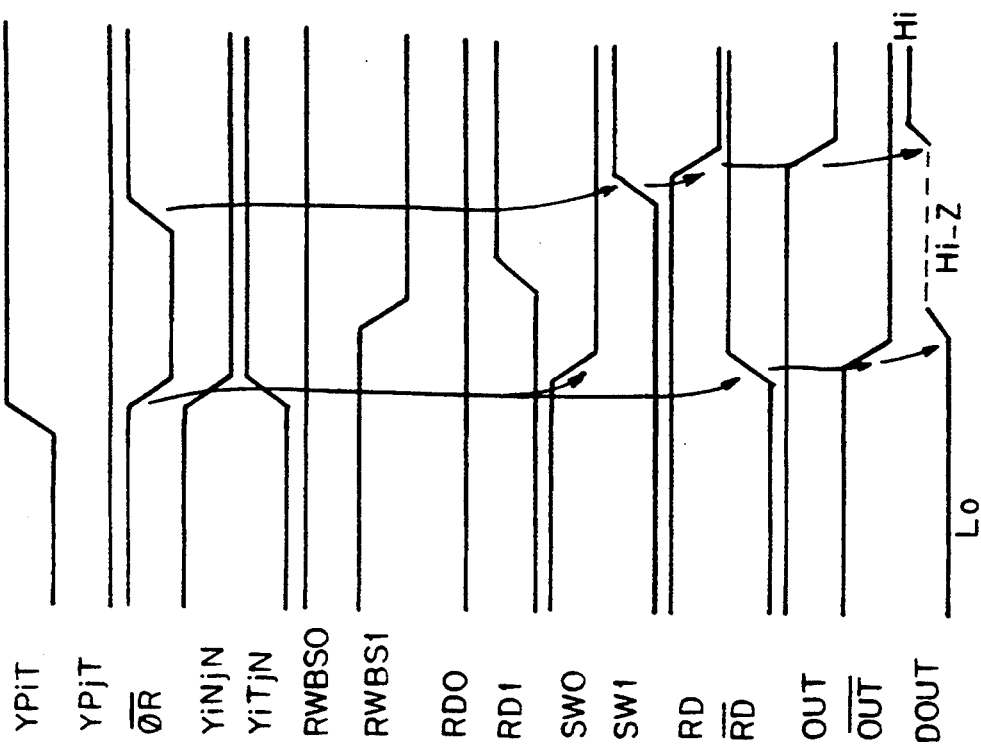

SEMICONDUCTOR MEMORY DEVICE HAVING TEST CIRCUIT

BACKGROUND OF THE INVENTION

The present invention relates to a semiconductor memory device and, more particularly, to an improvement in a data output circuit of a random access memory device incorporated with a test circuit.

As well known in the art, a semiconductor memory device is required to have a memory cell correctly storing-logic "1" or "0" indicative of data and a data read/write circuit correctly operating to read and write data from and into a selected memory cell. It is therefore required to test the memory device to ensure the corrective operation of each memory cell and the date read/write circuit. In order to facilitate the test operation, a test circuit is incorporated into the memory device in general.

Referring to FIG. 1, a prior art memory device 100 includes first and second memory cell arrays 6-1 and 6-2. Each of the cell arrays 6-1 and 6-2 has such a circuit construction as shown in FIG. 2. Particularly, the memory cell array 6 includes two pairs of data input/output lines Ioi, $\overline{Ioi}$ and Ioj, $\overline{Ioj}$, a plurality of column switches YSW, a plurality of sense amplifiers SA and a memory cell portion MC. The memory cell portion MC includes a plurality of word lines WL, a plurality pairs of bit lines DL and $\overline{DL}$ and a plurality of memory cells each disposed at a different one of intersections of the word and bit lines. Since this memory circuit is well known in the art, the further description will be omitted.

Referring back to FIG. 1, the data input/output line pairs (Io0, $\overline{Io0}$) to (Io3, $\overline{Io3}$) from the memory cell arrays 6 are connected to data amplifiers DA0 to DA3 respectively. The data amplifiers DA0–DA3 are in turn connected to data bus lines RWB0–RWB3, respectively. Connected between the data bus lines RWB and an output terminal DOUT is an output circuit 9. Although not shown, the memory device 100 further includes an address buffer/decoder circuit as well as a data write circuit, as well known in the art.

The memory device 100 thus constructed performs data read and write operations on one memory cell in a selected one of the arrays 6 in a normal operation. As mentioned hereinbefore, it is required to test a circuit operation. For this purpose, a test data is written into a selected memory cell and then the data stored in that memory cell is read out therefrom. At this time, if the test data write operation would be carried out one cell by one, it would take a relatively long time period. Therefore, the memory device 100 is constructed such that a plurality of memory cells are selected and written with the same data simultaneously with each other in a test operation mode. Further, there is provided one output terminal DOUT, and hence it is impossible to simultaneously read out data from the selected two or more memory cells. Accordingly, the output circuit 9 is provided with a comparator circuit to compare the data read out from the two or more selected memory cells and the comparison resultant data is outputted from the terminal DOUT. In this memory device 100, two memory cells in each of the cell arrays 6, i.e. four memory cells in total, are selected simultaneously in a test mode. Moreover, this memory device 100 further supports such another test mode that one memory cell in each of the cell array blocks 6, i.e. two memory cells in total, are selected simultaneously. In the following description, the former test mode is called a first test mode and the latter test mode is done as a second one.

When a normal mode as a read operation is designated by the high level of test signals $\overline{TE1}$ and $\overline{TE2}$ (FIG. 3), one of column selection signals YiTiN, YiTjN, YiNjT and YiTjT takes an active high level by an address decoder circuit ASG comprising NAND gates G14–G22 and inverters I15–I21, and the remaining column selection signals take the low level. Consequently, one of data amplifiers DA0–DA3 is activated by the corresponding high level column selection signal to respond to data appearing on the corresponding data line pair Ioi, $\overline{Ioi}$. The activated data amplifier DA then outputs onto the corresponding data bus RWB logic "1" or "0" indicative of the data supplied thereto. In the normal data read mode, the data outputted by the activated data amplifier DA Data is transferred an input node RD via a corresponding one of inverters I0–I3 and activated or switched one of transfer-gates TG0–TG3, which is controlled by switching control signals SW0–SW3 generated by a switch signal generator SSG1 (FIG. 5) comprising NAND gates G24–G27, inverters I23–I29 and NOR gates G28 and G29. The data on the selected data bus RWBS is further transferred to an input node $\overline{RD}$ via the corresponding one of transfer-gates TG4–TG7 controlled by switching signals SW0–SW3. The input nodes RD and $\overline{RD}$ are connected to one input ends of NOR gates G8 and G9, respectively, each of which has the other input end connected in common to the output end of a NAND gate G7. This gate G7 outputs the low level at a timing of driving the data terminal DOUT. Assuming that the data outputted by the activated data amplifier DA takes the high level, the input nodes RD and $\overline{RD}$ are changed to the low and high levels, respectively, to turn a P-channel MOS transistor TO1 on and an N-channel MOS transistor TO2 off. The output terminal DOUT is thus driven to the high level.

In a normal data write mode, both of the transistors TO1 and TO2 are maintained in the nonconductive state to bring the output terminal DOUT into a high impedance. On the other hand, the data write circuit (not shown) is activated to write data into a selected one of the memory cells.

When the test signal $\overline{TE1}$ is changed to the active low level while holding the test signal $\overline{TE2}$ at the high level, the first test mode is designated. In this mode, four memory cells are selected as mentioned above and the test data are first stored therein. Thereafter, the device is brought into a read mode, whereby all the data amplifiers DA0–DA3 are activated because all the selection signals YiTiN, YiTjN, YiNjT and YiTjT become the high level. At this time, the transfer gates TG0–TG7 and TG10–TG13 are closed, whereas the those TG8 and TG9 are made open. Accordingly, the respective data read out from the selected memory cells and transferred onto the data bus RWB through the data amplifiers DA are supplied to a NOR gate G1 and further to a NAND gate G2 whose outputs are in turn transferred to the nodes RD and $\overline{RD}$. When the selected four memory cell are correctly stored the test data of "1" and the data read circuit correctly reads out the same therefrom, only the transistor TO1 is turned on to drive the output terminal DOUT to the high level. In the case of the test data being "0", the transistor TO2 is turned on to drive the terminal DOUT to the low level. If some defective portion in circuit operation exists to transfer onto at least one data bus RWB such a data as being different from the remaining data, however, the gate G1 outputs the low level, whereas the gate G2 outputs the high level. For this reason, both of the transistors TO1 and TO2 are held at the non-conductive state to bring the output terminal DOUT into a high impedance state. Thus, four test bit data are compared with one another in the device 100 and the comparison resultant data is outputted from the terminal DOUT as the logic "1" or "0" or a high impedance state.

The second test mode is designated by the low level of the test signal $\overline{TE2}$ and the high level of the signal $\overline{TE1}$. Two data amplifiers DA0 and DA2 or DA1 and DA3 are thereby activated by an address signal YPiT shown in FIG. 3. When a address signal YPiT ia at the high level, the data amplifiers DA0 and DA2 are activated by column address signals YiNjN and YiNjT. In the case where the address signal YPiT is at the low level, on the other hand, the data amplifiers DA1 and DA3 are activated. In the same manner as described with reference to the first test mode, two bit data read out from the selected two memory cells are compared in the output circuit 9 by use of gates G3–G6 and G8 and G9 to output the comparison resultant data.

As apparent from the above description, the access path in the test mode is different from that in the normal mode. For this reason, an access check for a read access time cannot in the test mode simultaneously with a data read/write operation test. Moreover, when a data read/write operation test other than two or four bit data is further required, other circuits therefor are needed to thereby make the total circuit configuration complicated.

SUMMARY OF THE INVENTION

It is therefore an object of the present invention to provide a semiconductor memory device having an improved data output circuit.

It is another object of the present invention to provide a semiconductor memory equipped with such a test circuit that is constructed to be able to perform an access check simultaneously with a data read/write operation check.

A semiconductor memory device according to the present invention is featured by such an output circuit that includes first and second nodes, first and second transistors connected in series between the first node and a potential line, third and fourth transistors connected in series between the first node and the potential line, fifth and sixth transistors connected in series between the second node-and the potential line, seventh and eighth transistors connected in series between the second node and the potential lines, and an output logic circuit coupled to the first and second nodes for driving an output terminal to one of first and second logic levels when the first and second nodes take logic level different from each other and to a high impedance when the first and second nodes take logic levels equal to each other. The first and third transistors are supplied with data signals from and the fifth and seventh transistors are supplied with inverted signals of the data signals. In a normal mode, one of the second and fourth transistors and one of the sixth and eighth transistors are turned ON. On the other hand, all of the second, fourth, sixth and eighth transistors are turned ON in a test mode.

BRIEF DESCRIPTION OF THE DRAWINGS

The above and other objects, advantages and features of the present invention will be more apparent from the following description taken in conjunction with the accompanying drawings, in which

FIG. 4 is a circuit diagram indicative of another part of the control signal generator;

FIG. 5 is a circuit diagram indicative of still another part of the control signal generator;

FIG. 7 is a circuit diagram indicative of a control signal generator employed in the device shown in FIG. 6;

FIG. 8 is a timing chart indicating a normal read operation of the memory device shown in FIG. 6; and FIG. 9 is a timing chart indicating a test operation of the memory shown in FIG. 6.

DETAILED DESCRIPTION OF THE DRAWINGS

Figure 1:
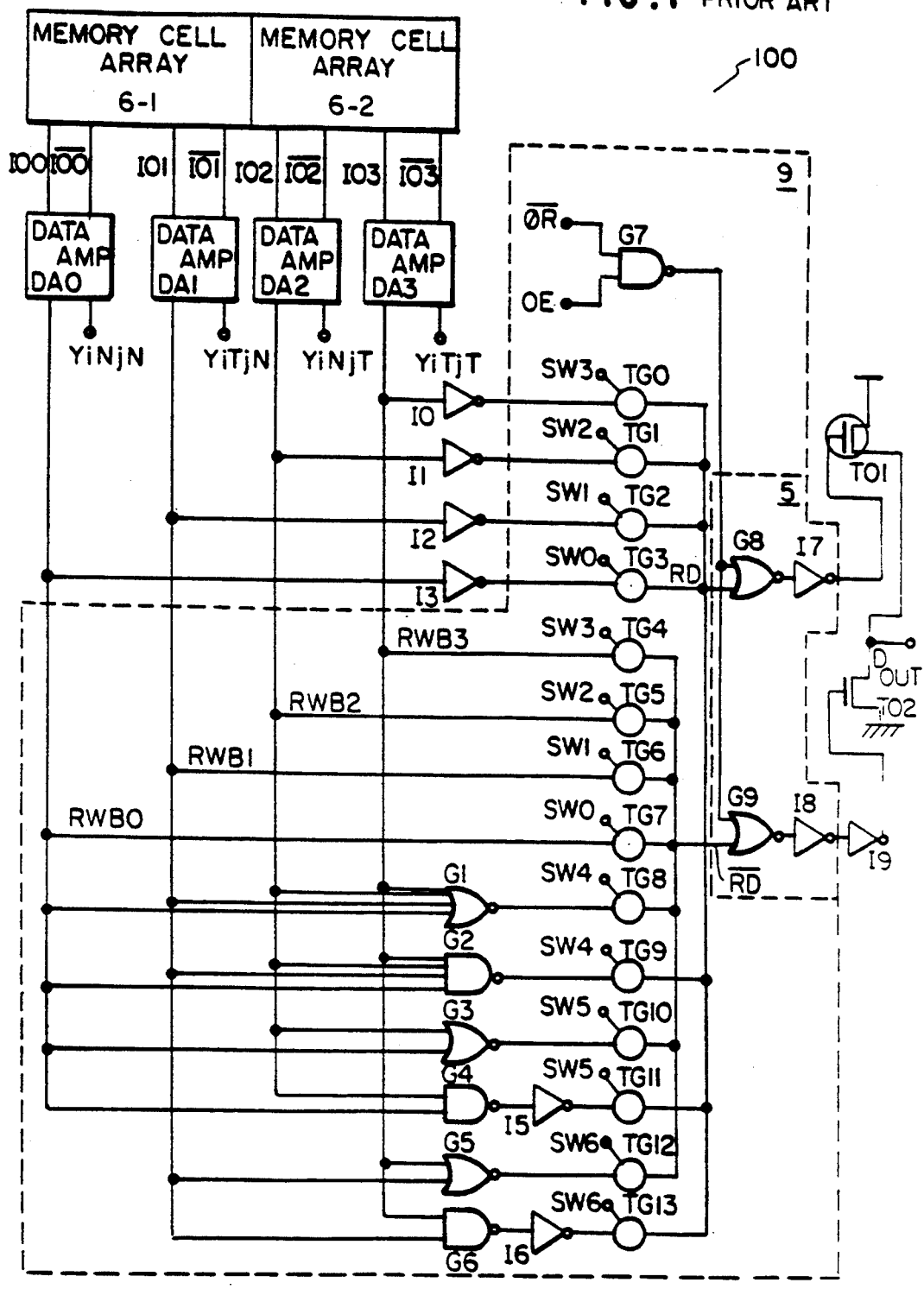
FIG. 1 is a circuit diagram illustrative of a semiconductor memory device according to the prior art.
Figure 2:
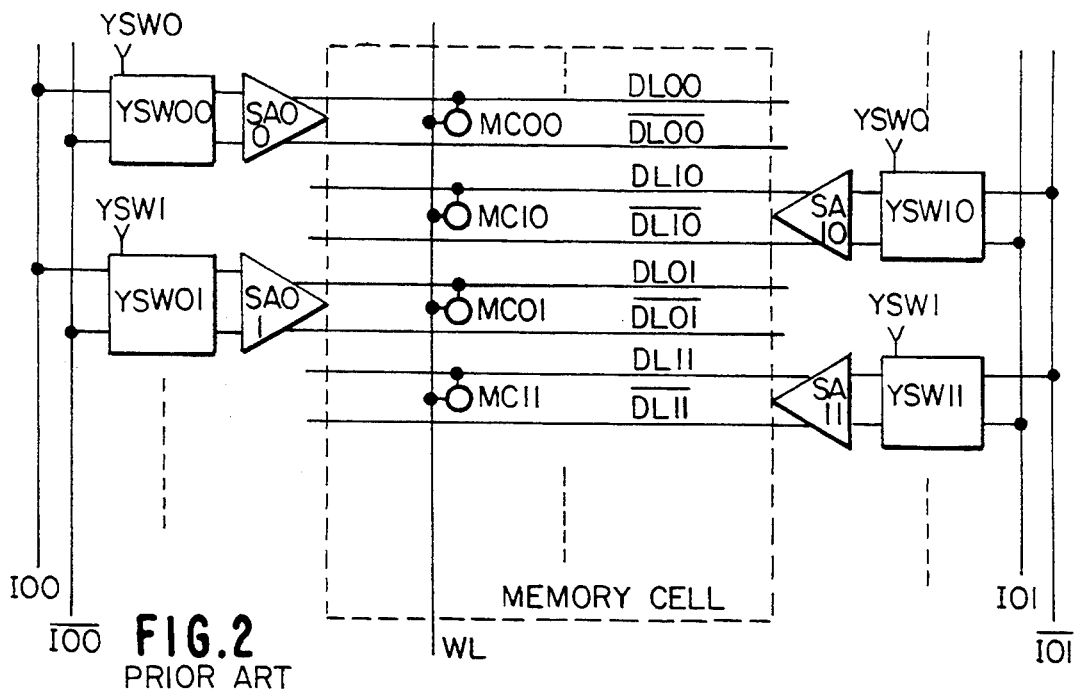
FIG. 2 is a circuit diagram illustrative of a memory cell array shown in FIG. 1.
Figure 6:
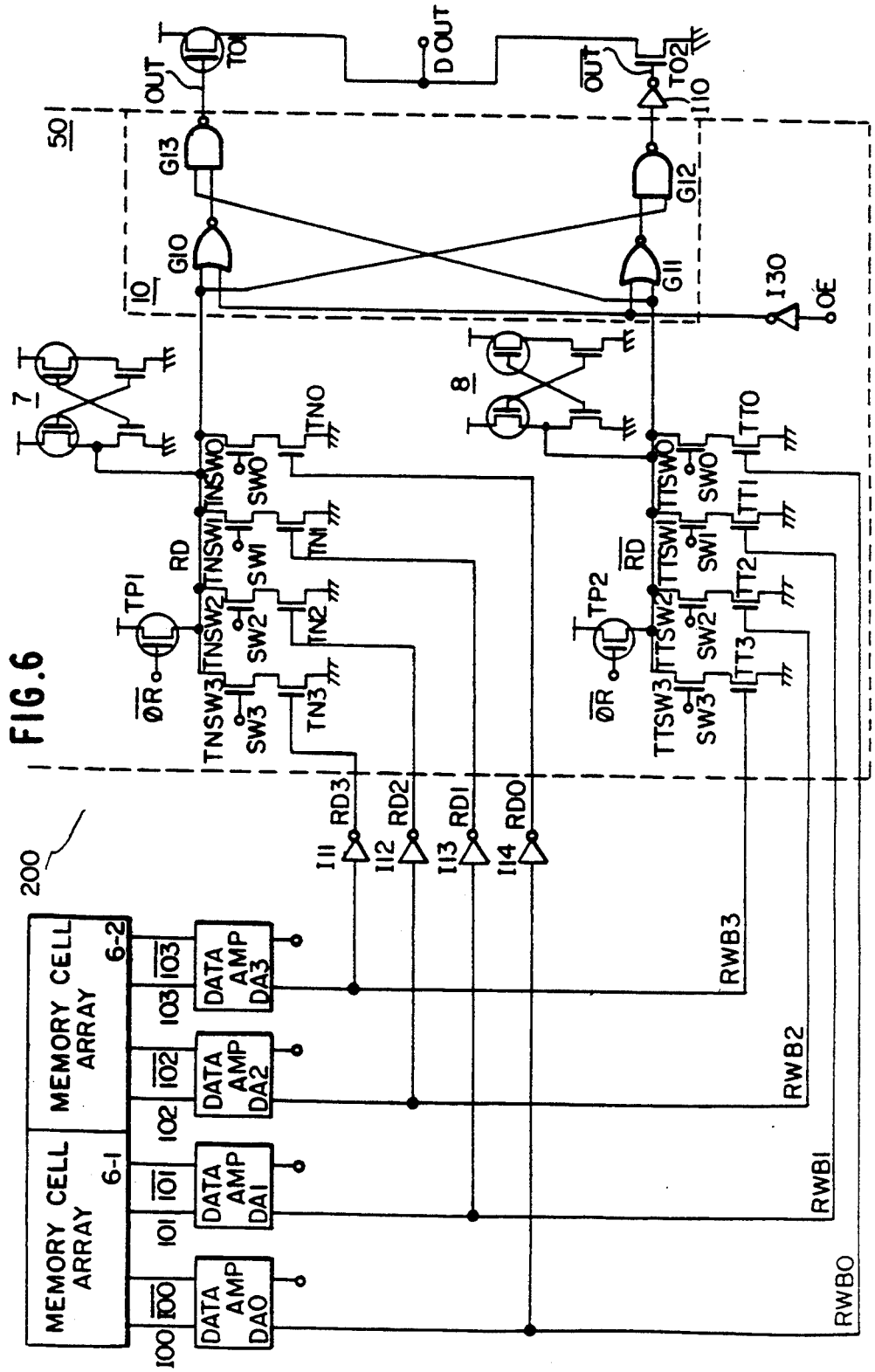
FIG. 6 is a circuit diagram illustrative of a semiconductor memory device according to an embodiment of the present invention.

Referring to FIG. 6, there is shown a semiconductor memory device 200 according to an embodiment of the present invention in which the same constituents as those shown in FIG. 1 are denoted by the same reference numerals to omit the further description thereof. This memory device 200 is different from the device of FIG. 1 in an output circuit 50. More specifically, the output circuit 50 includes a pair of circuit nodes RD and $\overline{RD}$. Connected in parallel between the node RD and the ground terminal are four series connection circuits each composed of N-channel MOS transistors TNSWi and TNi (i being 0, 1, 2, and 3). The transistors TNSW0–TNSW3 are supplied with switching signals SW0–SW3, respectively, and the transistors TN0–TN3 are supplied through inverters I0–I3 with the data signal appearing the data bus lines RWB0–RWB3, respectively. Similarly, four series connection circuits are connected in parallel between the node $\overline{RD}$ and the ground terminal, each composed of N-channel MOS transistors TTSWi and TTi (i being 0, 1, 2, and 3.) The transistors TTSW0–TTSW3 are supplied with the switching signals SW0–SW3, respectively and the transistors TT0–TT3 are supplied with the data signals appearing on the data bus lines RWB0–RWB3, respectively. Further connected to the nodes RD and $\overline{RD}$ are precharging transistors TP1 and TP2 supplied with a precharge signal OR, and voltage compensation circuits 7 and 8 of a flip-flop construction. The output circuit 50 further includes an out buffer 50 which are connected to the nodes RD and $\overline{RD}$ and has two NOR gates G10 and G11 and two NAND gates G12 and G13 which are connected as shown. The output buffer 10 is controlled by an output-enable signal OE through an inverter I30.

Figure 3A:
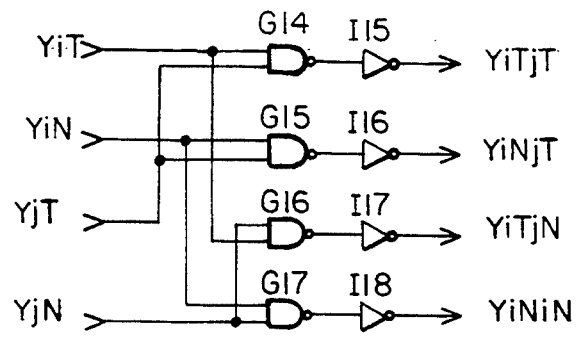
FIGS. 3A to 3C are circuit diagram indicative of a part of a control signal generator generating control signals.
Figure 3B:
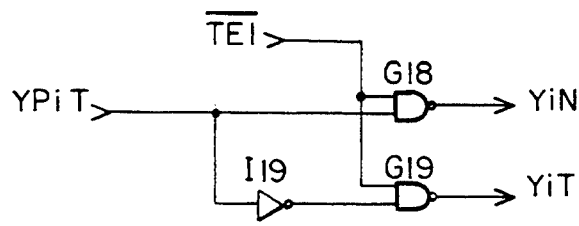
Figure 3C:
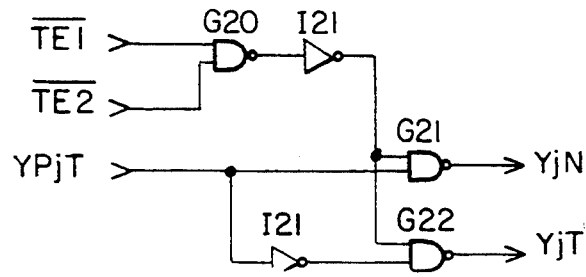

Referring to FIG. 7, the switching signals SW0–SW3 are generated by a signal generator SSG2 comprised of NAND gates G30–G33 and invertors I31–I34 connected as shown. The precharging signal is generated as an address transition detection signal $\overline{\phi R}$ which takes the high level when an address changes. The other signals YiNjn-YiTjT are generated by the circuit shown in FIGS. 3–5.

Turning back to FIG. 6, operations in a normal mode and test modes will be described below. The description on the operation in the normal mode will be made first with reference also to FIG. 8. In this mode, two memory cells are selected in each of the cell arrays 6-1 and 6-2, and the respective data read therefrom are supplied to the data amplifiers DA0–DA3 through the data input/output lines I00–I03 and I00–I03. One of the data amplifiers DA0–DA3 is activated in this mode by the column selection signals YiNjN, YiTjN, YiNjT and YiTjT. The activated data amplifier amplifies the data signals supplied thereto and drive the corresponding data bus RWB in response thereto. In this description, the change in address causes the address change detection signal $\overline{\phi R}$ from the high level to low level and the column selection signal YiNjN from the high level to low level by change in the address signal YPiT from the low level to high level. Therefore, the data amplifier DA0 is activated and the data bus RWB 1 is changed from the high level to low level by the data from the selected memory cell.

On the other hand, the transistors TP1 and TP2 precharging the nodes RD and RD are rendered non-conductive by the address change detection signal $\overline{\phi R}$ having the high level. The level compensation circuits 7 and 8 temporarily holds the level at the input nodes RD and $\overline{RD}$. After the transistors TP1 and TP2 are turned off, one of the switching signals SW0–SW3 takes the active level by the address change detective signal $\overline{\phi R}$ and the column address signals YiTiN, YiTjN, YiNjT and YiTjT from the switching signal generator SSG2. In the present description, the switching signal SW1 becomes the active high level and the remaining switching signals SW0, SW2 and SW3 become Low level. Consequently, the transistors TTSW1 and TNSW1 are turned on. The transistor TT1 is also turned on by the high level data signal appearing the data bus RWB0. On the other hand, the transistor TN1 is in the non-conductive state by the inverter I1. Therefore, the input node RD is discharged to the low level by the transistor TN1 and the switching transistor TNSW1, whereas the input node $\overline{RD}$ is kept at the high level. The output buffer 10 activated by the output activation signal OE drives therefore the output terminal DOUT to the high level by applying the gates the transistors TO1 and TO2 with the high level and low level, respectively. When the data signal on the bus RWB1 takes the low level, the input node RD and $\overline{RD}$ are at the high level and low level, respectively, so that the output terminal DOUT is driven to the low level.

When the signal OR is changed to the low level, the transistors TNSW0–TNSW3 and TTSW0–TTSW3 are tuned off and the precharging transistors TP1 and TP2 are turned on. Accordingly, the nodes RD and $\overline{RD}$ are changed to the high level to bring the output terminal DOUT into a high impedance state.

Next, the test mode operation will be described below with reference also to FIG. 9. When the test signal $\overline{TE1}$ is changed to the low level, the first test mode is designated for testing four memory cells. Therefore, all the column selection signals YiNjN, YiTjN, YiNjT and YiNjN become the high level. Consequently, all the data amplifiers DA0–DA3 are activated to drive the data buses RWB0–RWB3 in response to the data read out from the selected memory cells.

The data signal thus appearing the data bus lines RWB are supplied respectively to the transistors TT0–TT3 and further to transistors TN0–TN3 via inverters I1-1–I14. When the address change detective signal $\overline{\phi R}$ becomes the high level, the switching transistors TTSW0–TTSW3 and TNSW0–TNSW3 are tuned on by signals from the switching signal generator SSG2. Assuming that all the data signals on the data buses RWB0–RWB3, are at the high level, the input node $\overline{RD}$ is discharged to the low level by transistor TT0–TT3 and the input node RD is held at high level, so that the output terminal DOUT is driven to the high level. When all the data signals on the data buses are at the low level, on the other hand, the input node RD is discharged to the low level by transistor TN0–TN3 and the input node $\overline{RD}$ maintains the high level. The output terminal DOUT is thus driven to the low level.

If at least one of the data signal on the corresponding data bus RWB is different from the remaining data signals due to the defects in memory cell and/or read/write circuit, at least one of transistors TT0–TT3 is turned on and at least one of transistors TN0–TN3 is also turned on. Therefore, both of the input nodes RD and $\overline{RD}$ are discharged to the low level. Both of the NAND gates G12 and G13 output the low level. As a result the output terminal DOUT is brought into a high impedance state.

The second test mode is designated by the low level of the test signal $\overline{TE2}$ while holding the test signal $\overline{TE1}$ at the high level. In this mode, the data amplifiers DA0 and DA2 or the data amplifiers DA1 and DA3 are activated in accordance with the level of the address signal YPiT. Assuming that the data amplifiers DA0 and DA2 are activated, only the switching signals SW0 and SW0 takes the active high-level. Thus, the output terminal DOUT is driven to the high or low level or brought into a high impedance state in accordance with the levels of the two data signals.

As described above, the memory device 200 shown in FIG. 6 preforms the first and second test operations as well as the normal mode operation. Moreover, in either first or second operation, the data propagation path is the same as that in the normal operation. Therefore, the read access time check is attained simultaneously with the first and/or second test mode operation. Moreover, even when other test operations than two-or four-bit test are required, only such a circuit modification is needed that the series connection circuits are connected between each of the nodes RD and $\overline{RD}$ and the ground terminal.

It is apparent that the present invention in not limited to the above embodiment but may be modified and changed without departing from the scope and spirit of the invention.

What is claimed is:

1. A semiconductor memory device comprising a memory cell array including a plurality of memory cells arranged in rows and columns, first and second data bus lines, means for coupling in a normal mode one of said first and second data bus lines to said memory cell array and in a test mode said first and second data bus lines to said memory cell array, an output terminal, and an output circuit coupled to said first and second data bus lines and said output terminal, said output circuit including first and second circuit nodes, first and second transistors connected in series between said first node and a first potential line, third and fourth transistors connected in series between said first node and said first potential line, fifth and sixth transistors connected in series between said second node and said first potential line, seventh and eighth transistors connected in series between said second node and said first potential line, means for driving said first and third transistors in response to signal levels on said first and second bus lines, respectively, means for driving said fifth and seventh transistors in response to inverted signal levels of said signal levels, respectively, means for turning in said normal mode one of said second and fourth-transistors and one of said sixth and eighth transistors ON and in said test mode all of said second, fourth, sixth and eighth transistors ON, and output means coupled to said first and second nodes and said output terminal for driving said output terminal to one of first and second logic levels when said first and second nodes takes logic levels different from each other and to a high impedance state when said first and second nodes takes logic levels equal to each other.

2. The memory device as claimed in claim 1, wherein said output means comprises a ninth transistor connected between said output terminal and said first potential line, a tenth transistor connected between said output terminal and a second potential line, first gate circuit for turning said first transistor ON when said first and second nodes respectively take said first and second logic levels and OFF when said first and second nodes takes the logic levels equal to each other, and a second gate circuit for turning said second transistor ON when said first and second nodes respectively take said second and first logic levels and OFF when said first and second transistors OFF when said first and second nodes take the logic levels equal to each other.

3. A semiconductor memory device comprising a memory cell array including a plurality of memory cells, first and second circuit nodes, a first potential line, a plurality of first circuits connected in parallel to each other between said first circuit node and said first potential line, a plurality of second circuits connected in parallel to each other between said second circuit node and said first potential line, means for selecting in a normal mode one of said memory cells to read out data from a selected one of said memory cells and for selecting in a test mode at least two of said memory cells to read out data from the selected at least two of said memory cells, one of said first circuits being activated to drive said first node in response to the data from said selected one of said memory cells, and one of said second circuits being activated to drive said second node in response to inverted data of the data from said selected one of said memory cells in said normal mode, at least two of said first circuits being activated to drive said first node in response to the data from said selected at least two of said memory cells and at least two of said second circuits being activated to drive said second node in response to inverted data of the data from said selected at least two of said memory cells, and means coupled to said first and second nodes for outputting an output data signal which takes one of said first and second levels when said first and second nodes take logic levels different from each other and for presenting a high impedance when said first and second nodes have logic levels equal to each other.

4. The memory device as claimed in claim 3, wherein said one of said first circuits is included in said at least two of said first circuits, and said one of said second circuits is included in said at least two of said second circuits.

* * * * *